United States Patent
Straeussnigg

(10) Patent No.: US 11,659,329 B2
(45) Date of Patent: May 23, 2023

(54) EFFICIENT SEAMLESS SWITCHING OF SIGMA-DELTA MODULATORS

(71) Applicant: Infineon Technologies AG, Neubiberg (DE)

(72) Inventor: Dietmar Straeussnigg, Villach (AT)

(73) Assignee: Infineon Technologies AG, Neubiberg (DE)

(*) Notice: Subject to any disclaimer, the term of this patent is extended or adjusted under 35 U.S.C. 154(b) by 24 days.

(21) Appl. No.: 17/395,077

(22) Filed: Aug. 5, 2021

(65) Prior Publication Data

US 2023/0040501 A1 Feb. 9, 2023

(51) Int. Cl.
 *H04R 3/04* (2006.01)
 *H03M 3/00* (2006.01)
 *H03M 1/18* (2006.01)

(52) U.S. Cl.
 CPC ............... *H04R 3/04* (2013.01); *H03M 1/18* (2013.01); *H03M 3/488* (2013.01)

(58) Field of Classification Search
 None
 See application file for complete search history.

(56) References Cited

U.S. PATENT DOCUMENTS

| | | | |
|---|---|---|---|
| 6,804,291 B1 | 10/2004 | Easwaran et al. | |
| 2009/0238379 A1 | 9/2009 | Feng | |
| 2014/0270261 A1* | 9/2014 | Wiesbauer | H03M 1/60 341/110 |
| 2015/0256925 A1 | 9/2015 | Lesso | |
| 2016/0314805 A1* | 10/2016 | Mortazavi | G10L 21/034 |
| 2016/0365081 A1 | 12/2016 | Satoskar et al. | |
| 2017/0230750 A1 | 8/2017 | Pawlowski et al. | |
| 2021/0229980 A1 | 7/2021 | Straeussnigg et al. | |
| 2021/0235200 A1 | 7/2021 | Straeussnigg et al. | |

FOREIGN PATENT DOCUMENTS

| | | |
|---|---|---|
| EP | 3855764 A1 | 7/2021 |
| WO | 9615484 A2 | 5/1996 |
| WO | 2007009465 A2 | 1/2007 |

* cited by examiner

*Primary Examiner* — James K Mooney
(74) *Attorney, Agent, or Firm* — Slater Matsil, LLP

(57) ABSTRACT

A digital microphone includes at least one integrator; a state detection and parameter control component directly coupled to an output of the integrator; and a signal processing component coupled to an output of the state detection and parameter control component, wherein a parameter of the signal processing component includes a first value in a first operational mode and a second value in a second operational mode different from the first operational mode.

13 Claims, 15 Drawing Sheets

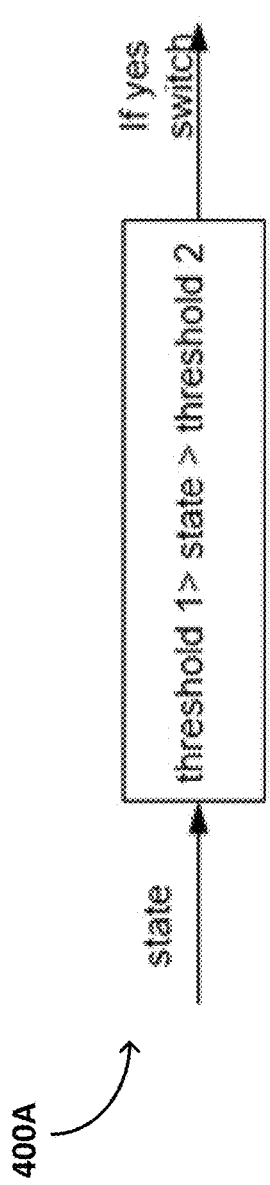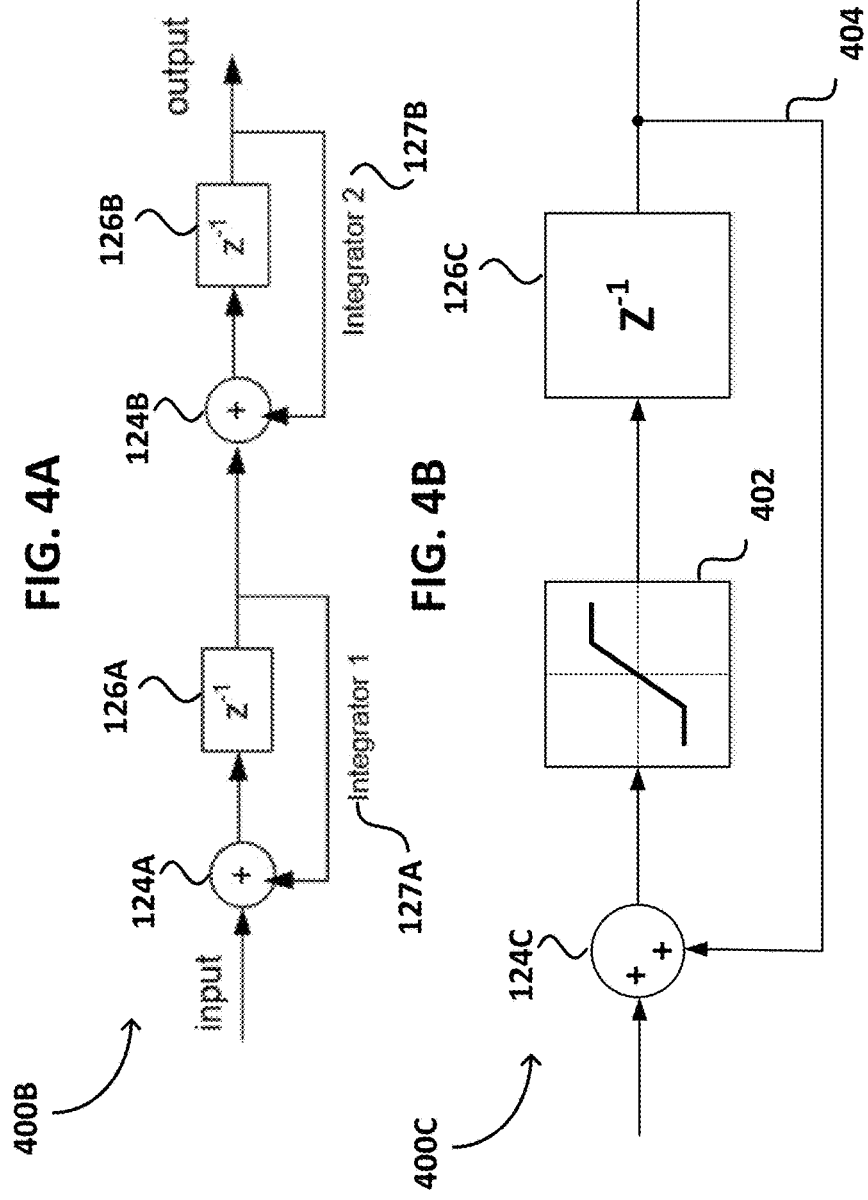

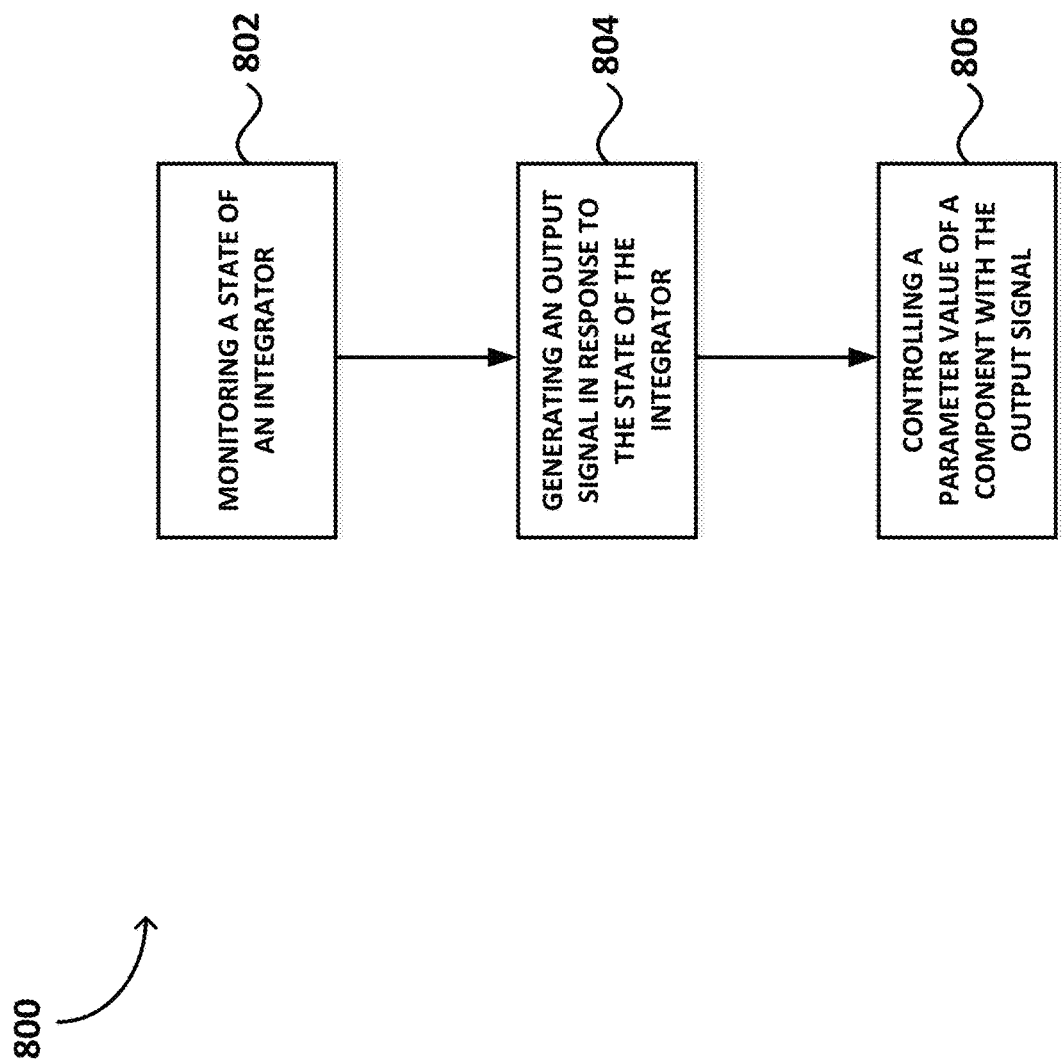

EFFICIENT SEAMLESS SWITCHING OF SIGMA-DELTA MODULATORS

TECHNICAL FIELD

The present invention relates generally to a system and method for efficient seamless switching of sigma-delta modulators.

BACKGROUND

The application of MEMS (microelectromechanical systems) technology to microphones has led to the development of small microphones with high performance. MEMS microphones offer high SNR (signal-to-noise ratio), low power consumption, good sensitivity, and are available in small packages that are compatible with surface mount assembly processes.

MEMS microphones use acoustic sensors that are fabricated on semiconductor production lines using silicon wafers. Layers of different materials are deposited on top of a silicon wafer and the unwanted material is then etched away, creating a moveable membrane and a fixed backplate over a cavity in the base wafer. The sensor backplate may be a stiff perforated structure that allows air to move easily through it, while the membrane is a thin solid structure that flexes in response to the change in air pressure caused by sound waves. Changes in air pressure created by sound waves cause the thin membrane to flex while the thicker backplate remains stationary as the air moves through its perforations. The movement of the membrane creates a change in the amount of capacitance between the membrane and the backplate, which is translated into an electrical signal by an ASIC (Application Specific Integrated Circuit). The ASIC measures the voltage variations caused when the capacitance between the membrane and the fixed backplate changes due to the motion of the membrane in response to sound waves. In many applications, a low noise audio Analog-to-Digital Converter (ADC) is needed to convert the output of analog microphones into digital format for processing and/or transmission. The ADC can be clocked at various frequencies in a tradeoff between microphone performance and microphone power consumption.

SUMMARY

According to an embodiment, a digital microphone comprises at least one integrator; a state detection and parameter control component directly coupled to an output of the integrator; and a signal processing component coupled to an output of the state detection and parameter control component, wherein a parameter of the signal processing component comprises a first value in a first operational mode and a second value in a second operational mode different from the first operational mode.

According to an embodiment, a digital modulator comprises a summer; at least one integrator coupled to the summer; a quantizer coupled to the at least one integrator; a state detection and control component coupled to an output of the at least one integrator; and a variable gain block coupled between the state detection and control component, and the summer.

According to an embodiment, a method of operating a digital microphone comprises monitoring a state of an integrator of the digital microphone; generating an output signal having a first level during a first state of the integrator and a second level during a second state of the integrator; controlling a parameter value of a signal processing component of the digital microphone with the output signal; and changing an operational mode of the digital microphone only during the first state of the integrator.

BRIEF DESCRIPTION OF THE DRAWINGS

For a more complete understanding of the present invention, and the advantages thereof, reference is now made to the following descriptions taken in conjunction with the accompanying drawings, in which:

FIG. 4A is a block diagram of the state detection and control component of the digital microphone shown in FIG. 1D, according to an embodiment;

FIG. 4B is a block diagram of a plurality of serially-coupled integrators that can substitute for the single integrator of the digital microphone shown in FIG. 1D, according to an embodiment;

FIG. 4C is a block diagram of an integrator including a saturation block that can be used for the single integrator of the digital microphone shown in FIG. 1D, according to an embodiment;

FIG. 8 is a block diagram of a method of operating a digital microphone that implements seamless dynamic parameter change, according to an embodiment.

DETAILED DESCRIPTION OF ILLUSTRATIVE EMBODIMENTS

Figure 1A:
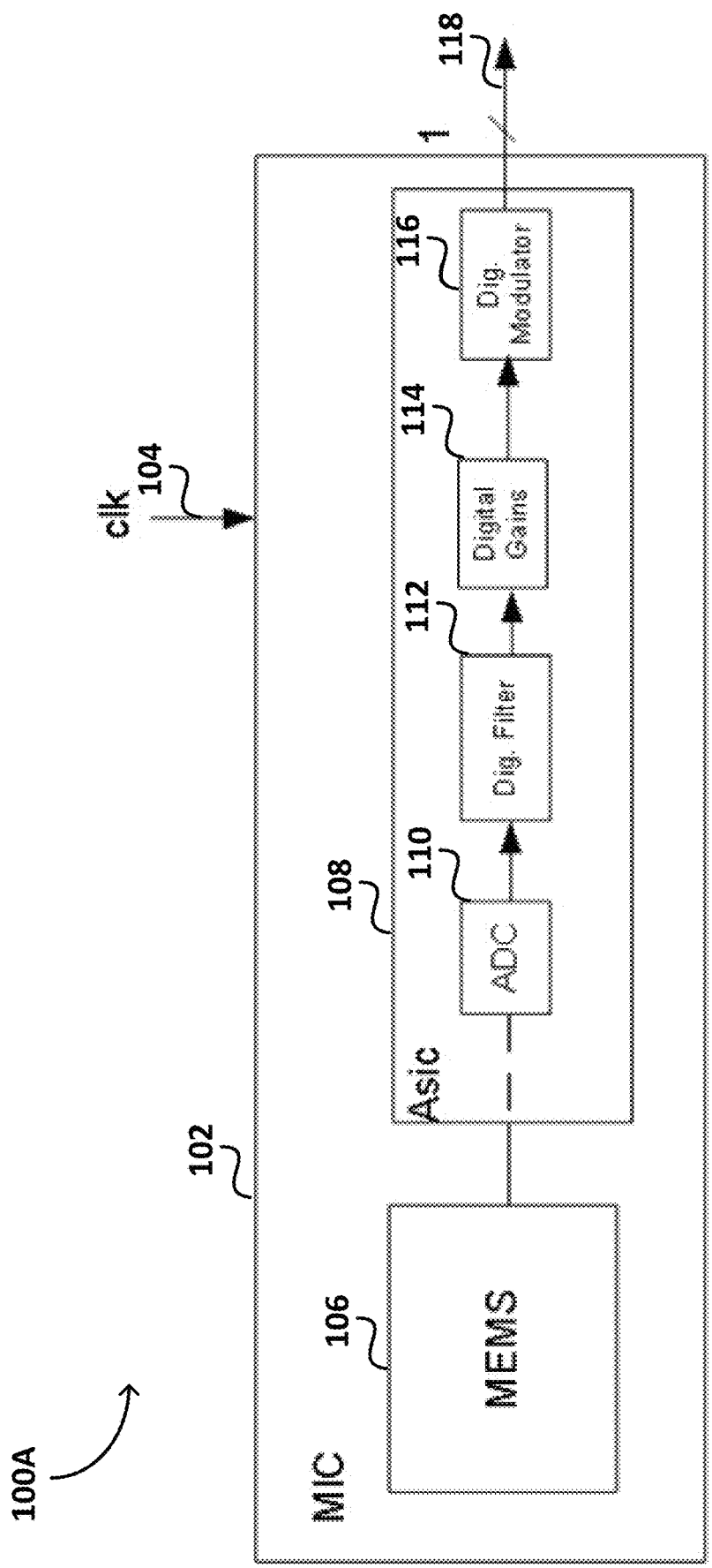
FIG. 1A is a block diagram of an exemplary digital microphone.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same or similar elements have been designated by corresponding references in the different drawings if not stated otherwise.

While embodiments of the present invention are described in detail below, additional description and details of digital microphones and switching between operational modes of digital microphones are described in U.S. patent application Ser. No. 16/773,079 entitled "Configurable Microphone Using Internal Clock Changing," which is hereby incorporated by reference in its entirety; U.S. patent application Ser. No. 16/871,546 entitled "Configurable Microphone Using Internal Clock Changing," which is hereby incorporated by reference in its entirety; U.S. patent application Ser. No. 17/209,853 entitled "System and Method for Fast Mode Change of a Digital Microphone Using Digital Cross-Talk Compensation," which is hereby incorporated by reference in its entirety; and U.S. patent application Ser. No. 16/932,010 entitled "Efficient Digital Gain Implementation in Digital Microphones," which is hereby incorporated by reference in its entirety.

Digital microphones can be switched between a high performance operational mode and a low power consumption operational mode, with the digital microphone being placed into one of the two operational modes for extended periods of time ("static switching") or operated into one of the two operational modes indefinitely. However, in digital microphones there can also be a need to dynamically change parameters of signal processing components to compensate for environmental changes or to maintain performance requirements for other reasons. For example, the sampling clock frequency or sampling capacitor value of a sigma-delta ADC may be dynamically changed to support dynamic SNR adjustment or dynamic power saving strategies. To implement the dynamic changes a very fine gain or other adjustment within the digital microphone, not causing audible artefacts (anomalies introduced into a digital signal as a result of digital signal processing, for example), is sometimes needed.

Digital microphone embodiments are described herein for efficient dynamic switching of signal processing component parameters of a digital microphone causing minimal or inaudible artefacts. In some embodiments, parameters of an analog or digital sigma-delta modulator in a digital microphone are dynamically changed. In other embodiments parameters of an ADC in a digital microphone are dynamically changed. In embodiments, a state detection and control component monitors the output of one or more integrators in the digital microphone. If the integrator is in zero state (integrator output equal to a digital or analog zero value) or between first and second thresholds (integrator output different than a digital or analog zero value), a parameter of a signal processing component in the digital microphone can be safely adjusted without causing audible artefacts. If the integrator is a maximum positive state (integrator output equal to a digital plus one value or an analog positive voltage) or a maximum negative state (integrator output equal to a digital minus one value or an analog negative value) outside of the first and second thresholds, then the parameter of the signal processing component in the digital microphone cannot be adjusted without causing audible artefacts. According to embodiments, the adjustments can be made dynamically during or between operational modes. For example, seamless adjustments (adjustments that do not result in an audible transient response during a switching event) can be made to different levels of power savings within a power savings operational mode. Various embodiments that enable dynamic seamless parameter adjustment inside of a digital microphone are described in further detail below.

In FIG. 1A an exemplary digital microphone 100A is depicted. Digital microphone 100A includes a MEMS device 106 coupled to an ASIC 108, both of which can be fabricated in a semiconductor package 102. The digital microphone 100A receives a clock signal (CLK) 104 that is distributed amongst one or more signal processing components of the digital microphone. MEMS device 106 can be a capacitive or piezoelectric type of MEMS device that generates an analog audio output signal in response to acoustic pressure waves. The ASIC 108 includes an ADC no, a digital filter 112, a digital gain block 114, and a digital modulator 116 for providing a single-bit output signal at output 118.

ASIC 108 thus reads the analog signal from the MEMS device 106, provides an analog-to-digital conversion of the analog signal, and provides additional digital signal processing. Digital modulator 116 provides a single-bit data stream that is a requirement in certain applications. The digital filter 112 includes, for example, DC-removal functionality and low pass filtering. The digital gains block 114 comprises a plurality of individual digital gain selections in order to satisfy different microphone sensitivity requirements for different customer applications. Example sensitivity settings include full scale sensitivity in calibration modes and numerous other sensitivity settings less than the full scale sensitivity for use in specific operational modes or for reasons of flexibility.

Figure 1B:
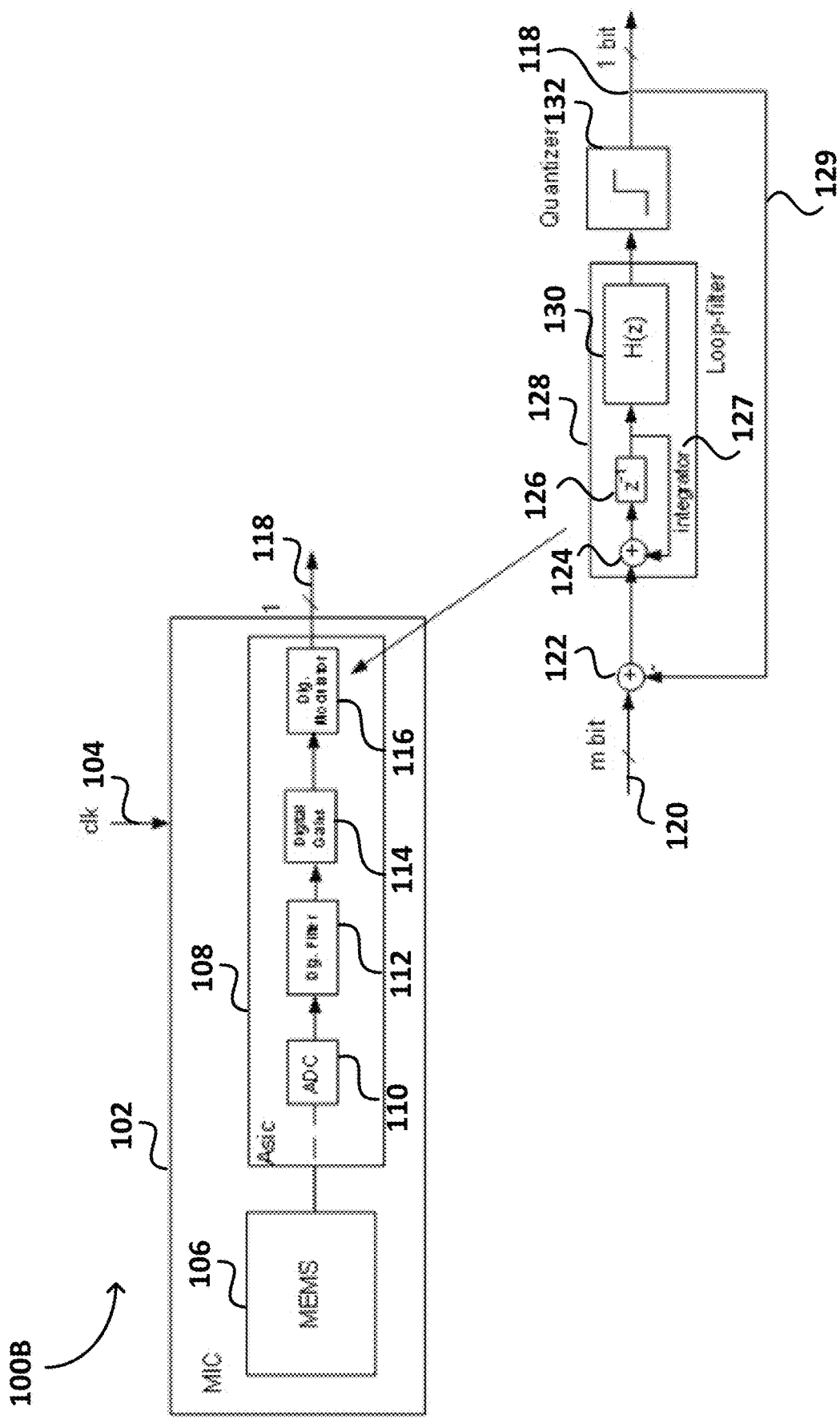
FIG. 1B is a block diagram showing further details of the digital modulator of the exemplary digital microphone of FIG. 1A.

FIG. 1B is a block diagram of a digital microphone 100B showing further details of the digital modulator of the exemplary digital microphone 100A of FIG. 1A including package 102, clock signal 104, MEMS device 106, ASIC 108, digital filter 112, digital gain block 114, and digital modulator 116, all previously described.

The lower portion of FIG. 1B shows the block diagram of digital microphone 100B with a more detailed representation of the digital modulator 116. In particular, digital modulator 116 is shown to include an integrator stage 127 and a loop filter 130 in block 128. Integrator stage 127 comprises a summer 124 and a block 126 labeled $z^{-1}$, which is the reciprocal Z transform transfer function, and a unity gain feedback loop between the output of block 126 and an input of summer 124. Loop filter 130 is labeled "H(z)," which is the filter transfer function. Loop filter 130 can comprise a digital low pass filter in embodiments.

Digital modulator 116 also includes an "m" bit input 120, wherein "m" is an integer greater than or equal to two, a summer 122 having an input coupled to "m" bit input 120 and an output coupled to the input of integrator stage 127. The output of integrator stage 127 is coupled to the input of loop filter 130. The output of loop filter is coupled to an input of quantizer 132, which converts the integrated and filtered "m" bit digital signal into a single-bit digital signal at output 118. A unity gain feedback path 129 couples the output 118 to an input of summer 122.

Figure 1C:
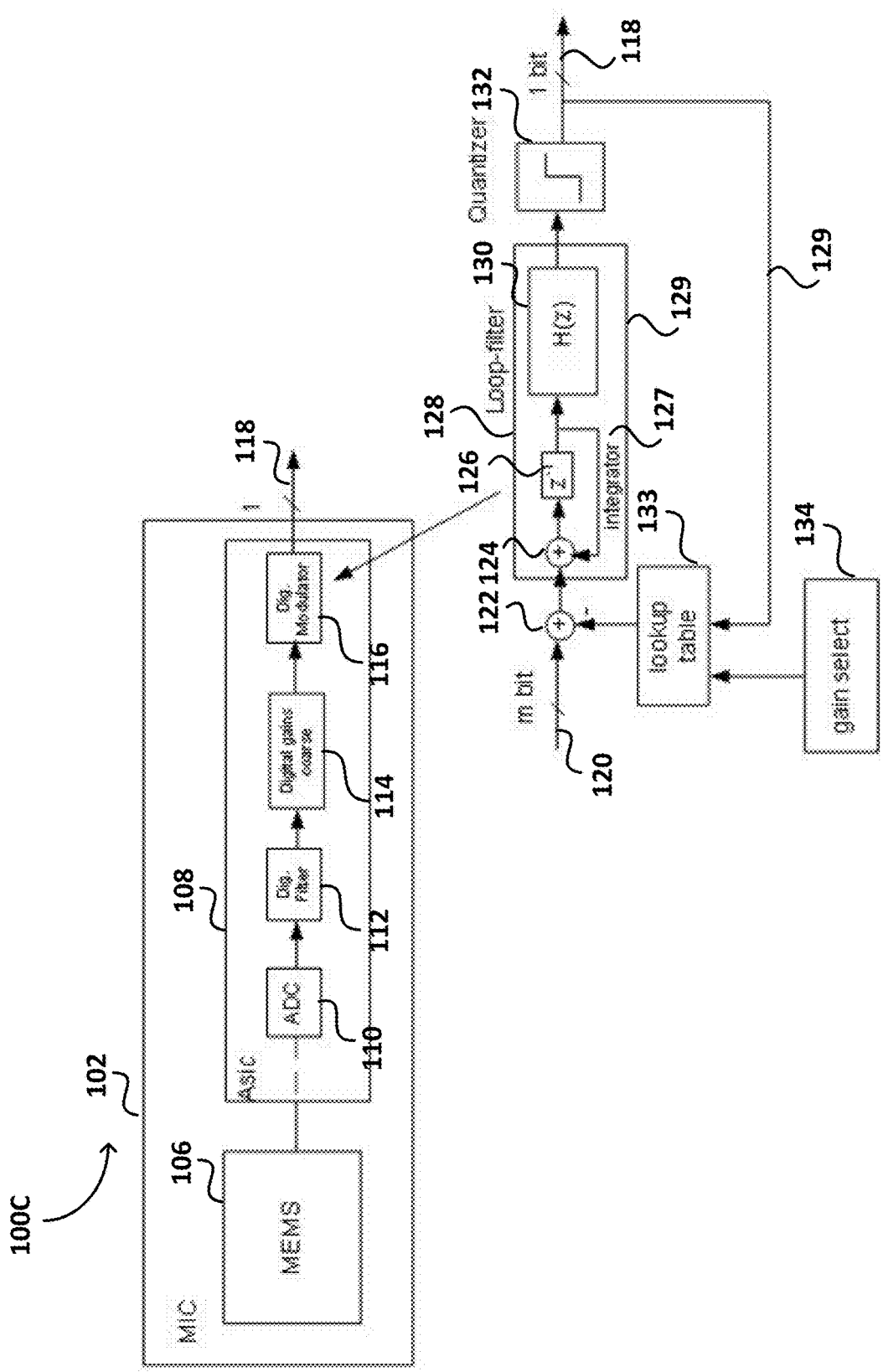
FIG. 1C is a block diagram of an exemplary digital microphone with efficient (static) digital gain adjustment.

FIG. 1C is a block diagram of an exemplary digital microphone 100C with efficient (static) digital gain adjustment. Digital microphone 100C includes package 102, MEMS device 106, ASIC 108, ADC no, digital filter 112, digital gain block 114, digital modulator 116, single-bit output 118, "m" bit input 120, summer 122, summer 124, block 126, block 128, loop filter 130, and quantizer 132, all previously described.

For sensitivity adjustment an efficient digital gain adjustment implementation includes a lookup table 133 interposed into feedback path 129 of digital modulator 116. The lookup table 133 is under the control of gain select block 134. While digital microphone 110C advantageously provides an efficient static digital gain adjustment, if dynamic gain adjustment is required audible artefacts could occur in some applications.

According to embodiments, a digital microphone and corresponding method for implementing dynamic parameter changes, for example dynamic gain or sensitivity changes, while minimizing audible artefacts generated by the dynamic parameter changes is described in detail below the proposal. According to embodiments, a state variable of an integrator output in the digital modulator or ADC of a digital microphone is monitored. When the output of the integrator is at or near a mean value (a zero value or state) between a positive maximum value (a positive one value or state) and a negative maximum value (a negative one value or state), a desired parameter of a component of the digital microphone is changed. As will be shown and described in embodiment examples, the integrator output oscillates around a mean value depending on the modulator or ADC input signal. Minimized transients occur if a desired parameter change (gain value, internal clock frequency, or capacitance value, for example) is applied when the integrator reaches the mean value, or within a threshold band around the mean value. If the parameter change is applied when the integrator reaches its maximum positive or negative values significant audible transients can occur. Various digital microphone, component, and method embodiments that implement dynamic parameter changes without causing significant audio artefacts are described in further detail below.

Figure 1D:
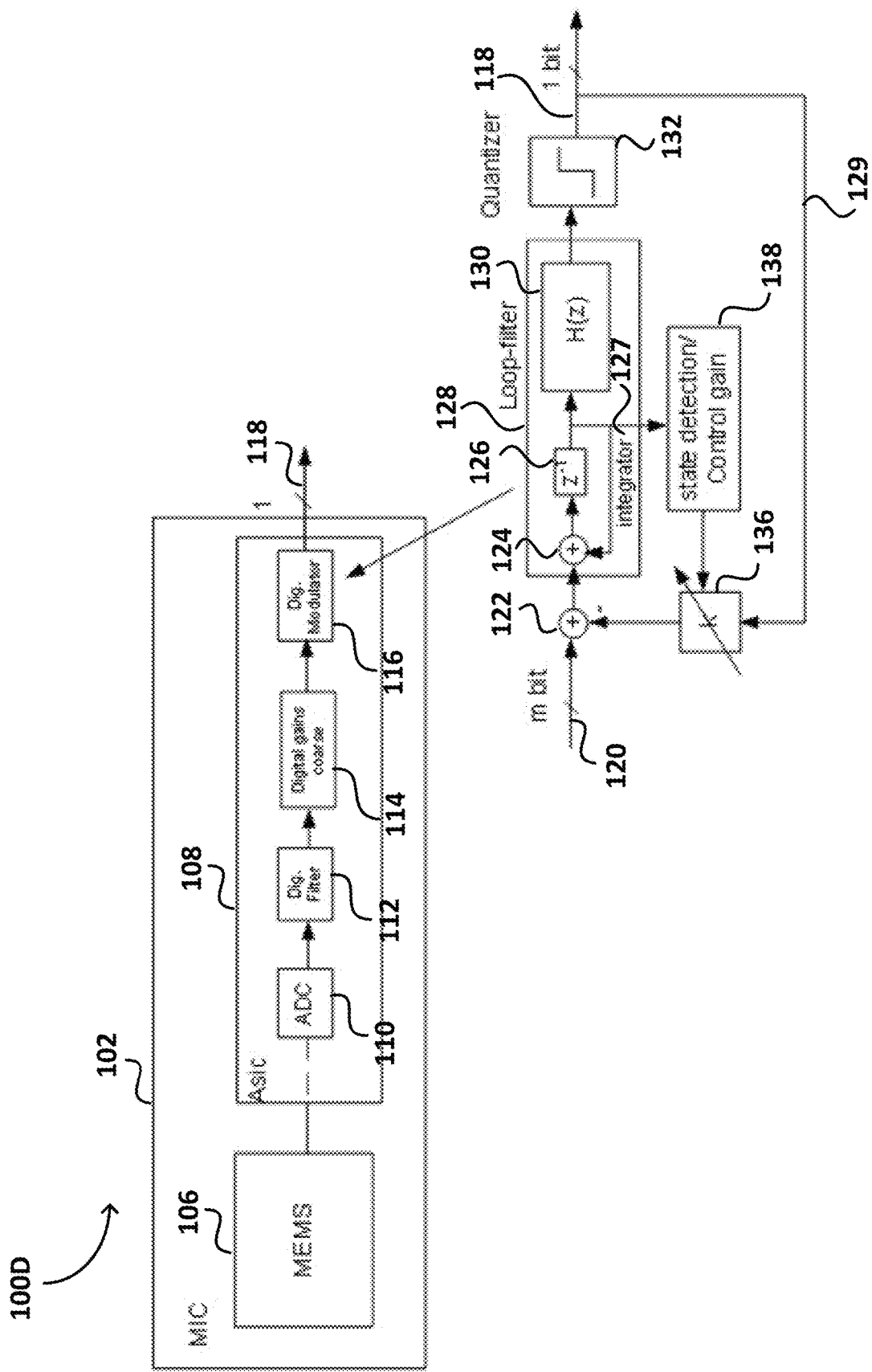
FIG. 1D is a block diagram of a digital microphone with efficient digital gain adjustment by changing the gain of a digital modulator based on the state of an integrator, according to an embodiment.

FIG. 1D is a block diagram of a digital microphone 100D that implements dynamic parameter changes without causing significant audio artefacts, according to an embodiment. More specifically digital microphone 100D comprises a dynamic digital gain adjustment including a state detection and gain control block 138, and a variable gain block 136 in the feedback loop of the digital modulator 116. Digital microphone 100D also includes package 102, MEMS device 106, ASIC 108, ADC no, digital filter 112, digital gain block 114, digital modulator 116, single-bit output 118, "m" bit input 120, summer 122, summer 124, block 126, block 128, loop filter 130, and quantizer 132, all previously described.

A dynamic digital gain adjustment implementation located within digital modulator 116 includes a state detection and a variable gain control block 138 having an input coupled to the output of integrator stage 127 within digital modulator 116. State detection and gain control block 138 monitors the output of integrator stage 127 and determines whether or not the integrator stage 127 is at the mean value, or within threshold limits of the mean value. If integrator stage 127 is determined to be at the mean value, or within the threshold limits of the mean value, a control portion of state detection and gain control block 138 will generate an appropriate control signal (having a level such as a logic one, for example) indicating that the parameter change can be made. If integrator stage 127 is determined to be at one of the maximum values, or not within the threshold limits of the mean value, the control portion of state detection and gain control block 138 will generate an appropriate control signal (having a level such as a logic zero, for example) indicating that the parameter change cannot be made. The variable gain control block 136 is interposed into feedback loop 129 between the single-bit output 118 and an input of summer 122. In embodiments, variable gain control block 136 comprises an adjustable digital gain block having a control input for receiving the control signal from the state detection and gain control block 138. In embodiments, the control signal determines whether or not the gain of the control block can be changed, and, if so, the gain change level that is desired. In embodiments, very small gain adjustments can be frequently made without causing corresponding audio artefacts.

Digital microphone 100D advantageously reduces or minimizes switching artefacts during a parameter switching event, and can be applied in a wide range of applications including digital and analog modulators, dynamic change of gains in modulators, dynamic change of sampling rates, and dynamic change of sampling capacitor values, which are described in further detail below. Digital microphone 100D advantageously provides dynamic parameter changes without additional group delay and with relatively low complexity circuit architecture. Additional filtering can be implemented, however, if the additional delay is acceptable for a given application.

Figures 2A, 2B:
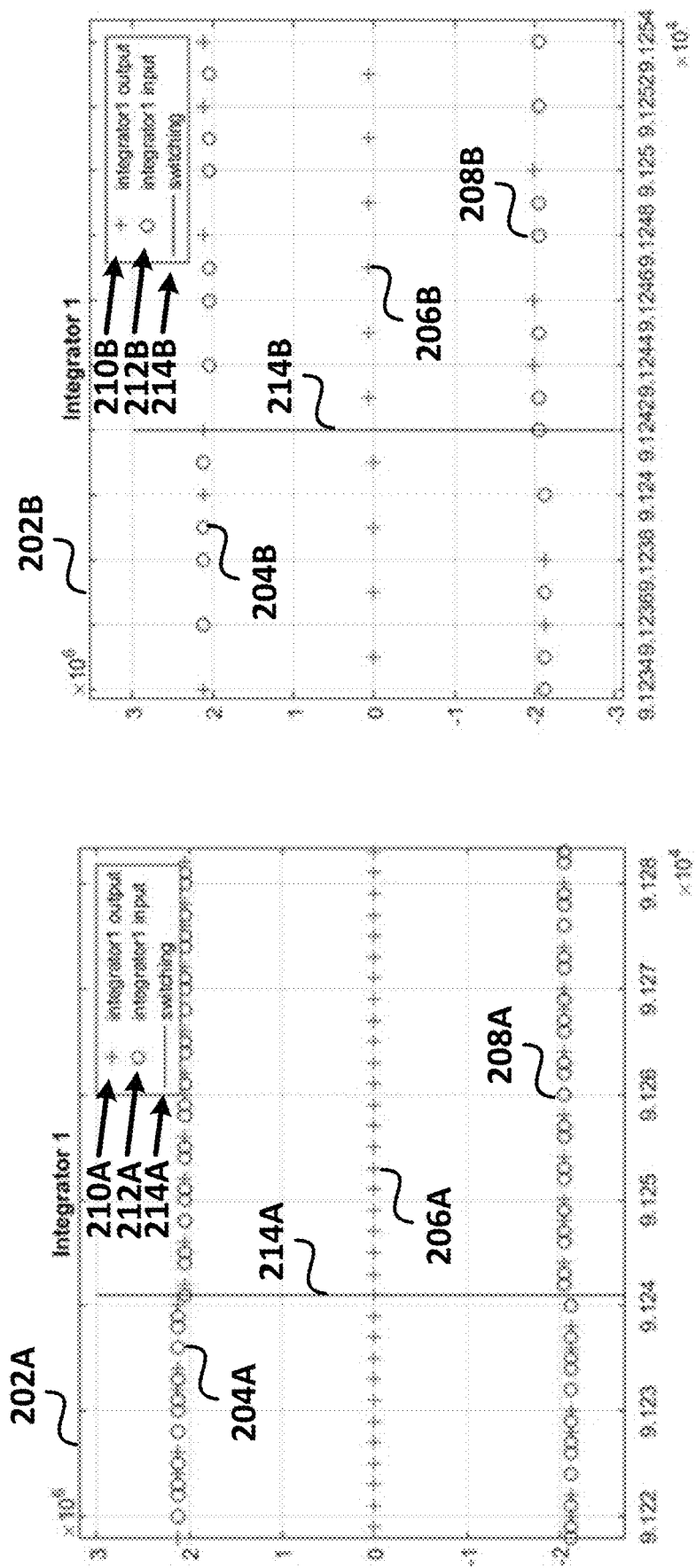
FIG. 2A is a graph of input and output sequences of an integrator that will result in minimal transients due to the detection of a zero integrator state during a switching event, according to an embodiment.
FIG. 2B is a graph of input and output sequences of an integrator that will result in significant transients due to the detection of a non-zero integrator state during a switching event, according to an embodiment.

FIG. 2A is a graph 202A of input and output sequences of an integrator that will result in minimal audible transients due to the detection of a zero integrator state during a switching event, according to an embodiment. The integrator input sequence is shown as a series of "0" symbols 212A clustered at the maximum positive value 204A and at the maximum negative value 208A. The integrator output sequence is shown as a series of "+" symbols 210A clustered at the maximum positive value 204A, at the mean value 206A, and at the maximum negative value 208A. A parameter switching event 214A is designated by solid vertical line. It is important to note that in FIG. 2A that the parameter switching event 214A occurs when the integrator output 210A is at the mean value 206A. Hence, the output of the digital microphone will only include minimal audible transients.

FIG. 2B is a graph 202B of input and output sequences of an integrator that will result in significant transients due to the detection of a non-zero integrator state during a switching event, according to an embodiment. The integrator input sequence is shown as a series of "0" symbols 212b clustered at the maximum positive value 204B and at the maximum negative value 208B. The integrator output sequence is shown as a series of "+" symbols 210B clustered at the maximum positive value 204B, at the mean value 206B, and at the maximum negative value 208B. A parameter switching event 214B is designated by solid vertical line. It is important to note that in FIG. 2B that the parameter switching event 214A occurs when the integrator output 210A is at the maximum positive value 204B. Hence, the output of the digital microphone will include significant audible transients.

Figure 3B:
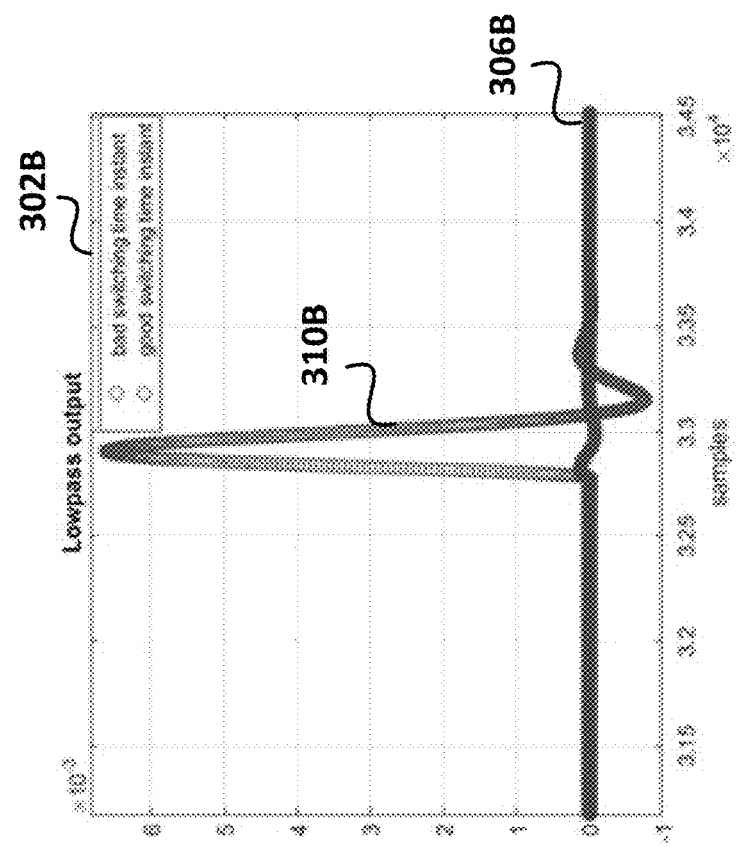
FIG. 3B is a graph comparing a low-pass filter output for a digital microphone with and without dynamic seamless switching during a switching event (for a zero modulator input)
Figure 3A:
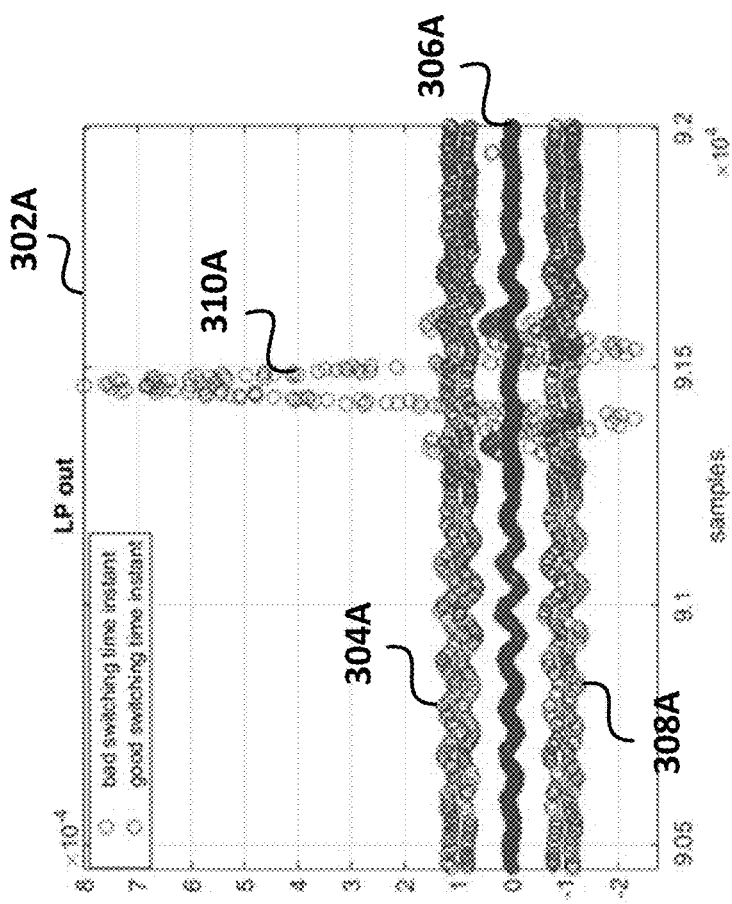
FIG. 3A is a graph comparing a low-pass filter output for a digital microphone with and without dynamic seamless switching during a switching event (for a switched modulator input)

FIG. 3A is a graph 302A comparing a low-pass filter output for a digital microphone with and without dynamic seamless switching during a switching event (for a switched modulator input). Traces 304A, 306A, and 308A are the low-pass filter outputs for a digital microphone associated with a good selection of a switching time instant (when an output of the integrator of the digital microphone is at a mean value). Traces 304A, 306A, and 308A are relatively flat, indicating that there are no or minimal audible transients present during the switching event. Trace 310A is the low-pass filter output for a digital microphone associated with a bad selection of a switching time instant (when an output of the integrator of the digital microphone is at a maximum positive value or a maximum negative value). Trace 310A shows a pronounced peak, indicating that presence of a significant audible transient during the switching event.

FIG. 3B is a graph 302B comparing a low-pass filter output for a digital microphone with and without dynamic seamless switching during a switching event (for a zero modulator input). Traces 306B is the low-pass filter output for a digital microphone associated with a good selection of a switching time instant (when an output of the integrator of the digital microphone is at a mean value). Trace 306B is relatively flat, indicating that there are no or minimal audible transients present during the switching event. Trace 310B is the low-pass filter output for a digital microphone associated with a bad selection of a switching time instant (when an output of the integrator of the digital microphone is at a maximum positive value or a maximum negative value, for example). Trace 310B shows a pronounced peak during a switching event, indicating that presence of a significant audible transient during the switching event.

FIG. 4A is a block diagram of a state detector and control block 400A that can be used to monitor the output of an integrator in a digital microphone, according to an embodiment. State detect and control block 400A includes digital signal processing elements for monitoring the output state of the integrator and deciding whether or not the output state of the integrator is between a first threshold and a second threshold. If yes, state detector and control block 400A generates an appropriate output signal capable of switching a component within the digital microphone. For example, the output signal may be used to switch a variable gain block as previously described, or may be used to switch between differently valued switched capacitors, or may be used to switch between different clock frequencies in embodiments. In some embodiments, the output of state detector and control block 400A may be one more control signals. In other embodiments, state detector and control block 400A may include additional control circuitry such as switches and other control circuitry.

FIG. 4B is a block diagram 400B of a plurality of serially-coupled integrators 127A and 127B that can substitute for the single integrator of the digital microphone shown in FIG. 1D, according to an embodiment. A first integrator 127A includes a first summer 124A and a first reciprocal Z transform transfer function block 126A. A second integrator 127B includes a second summer 124B and a second reciprocal Z transform transfer function block 126B. An input of second summer 124B is coupled to the output of the reciprocal Z transform transfer function block 126A. While only two integrator stages 127A and 127B are shown, any number can be used. For example, up to five serially-coupled integrators can be used in an embodiment. In some embodiments, the output of the last integrator of the plurality of serially-coupled integrators is monitored by the state detection and control block 128 shown in FIG. 1D.

FIG. 4C is a block diagram of an integrator 400C including a saturation block 402 that can be used for the single integrator of the digital microphone shown in FIG. 1D, according to an embodiment. Integrator 400C includes a summer 124C and a reciprocal Z transform transfer function block 126C similar to those previously described, wherein an output of reciprocal Z transform transfer function block 126 is coupled to an input of summer 124C through unity gain feedback path 404. Saturation block 402 is interposed between summer 124C and reciprocal Z transform transfer function block to ensure that there is a more even distribution of integrator stage output states that may be required in some applications.

Figure 5A:
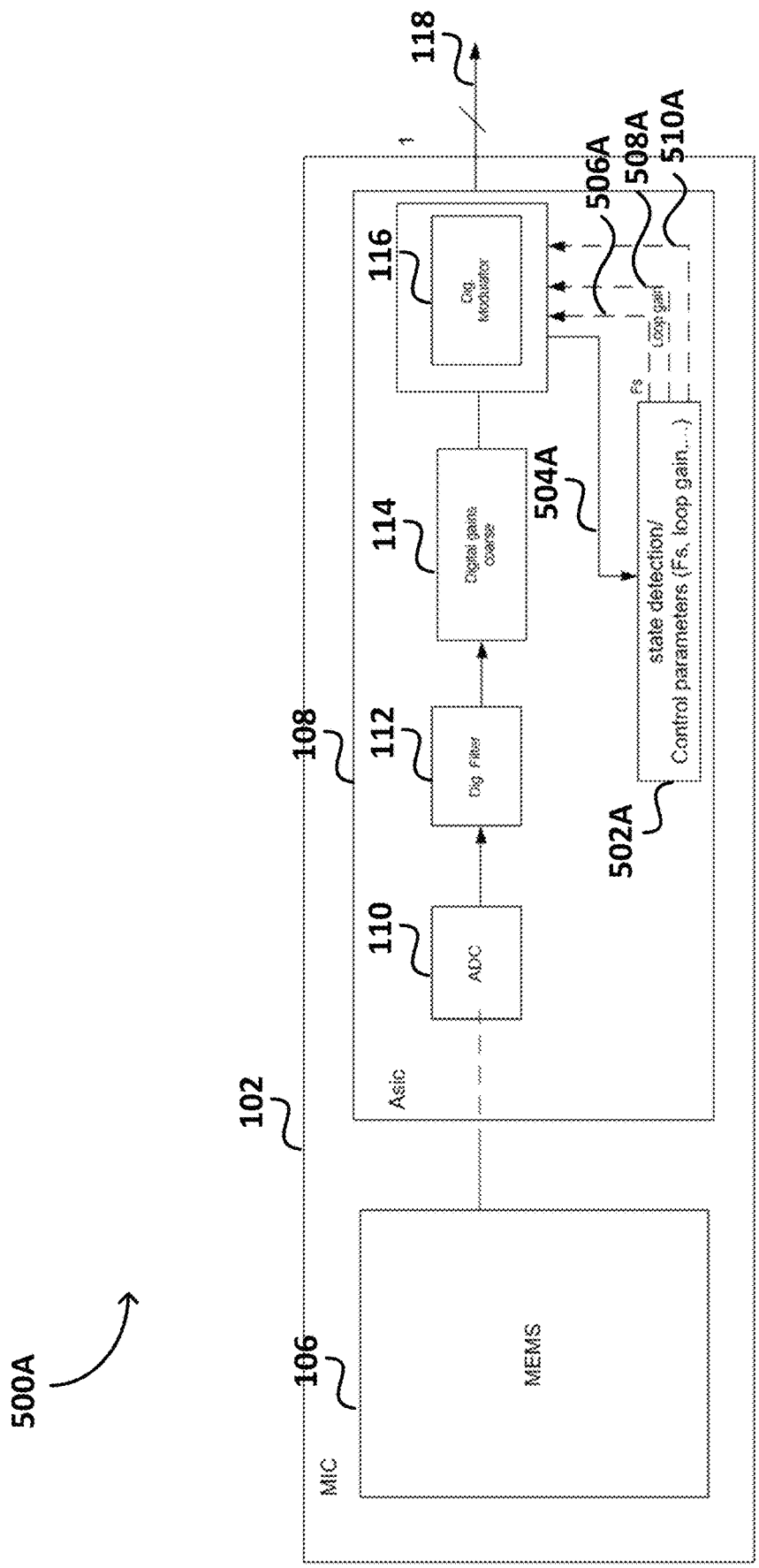
FIG. 5A is a block diagram of a digital microphone capable of a seamless dynamic parameter change in a digital modulator application, according to an embodiment.

FIG. 5A is a generalized block diagram of a digital microphone 500A having a dynamic parameter change in a digital modulator application, according to an embodiment. Digital microphone includes a package 102, a MEMS device 106, an ASIC 108, an ADC no, a digital filter 112, a digital gain block 113, a digital modulator 116 and a single-bit output 118, all previous described. Digital microphone 500A includes a state detection and parameter control block 502A having an input coupled to the digital modulator 116 (at an output of one or more integrators) and an output for controlling one or more components (for example a variable gain block) with one or more control signals. For example, the one more control signals can include a control signal 506A for controlling the frequency $F_s$ of a clock signal or other signal of the digital modulator 116, a control signal 508A for controlling the loop gain of the digital modulator 116 or the gain value of a gain block within the digital modulator 116, or a control signal 510A for controlling the value of other components, such as the capacitance of one or more switched capacitors in the digital modulator 116. While typically only one control signal is used, other embodiments can use more than one control signal to dynamically change more than one parameter simultaneously.

Figure 5B:
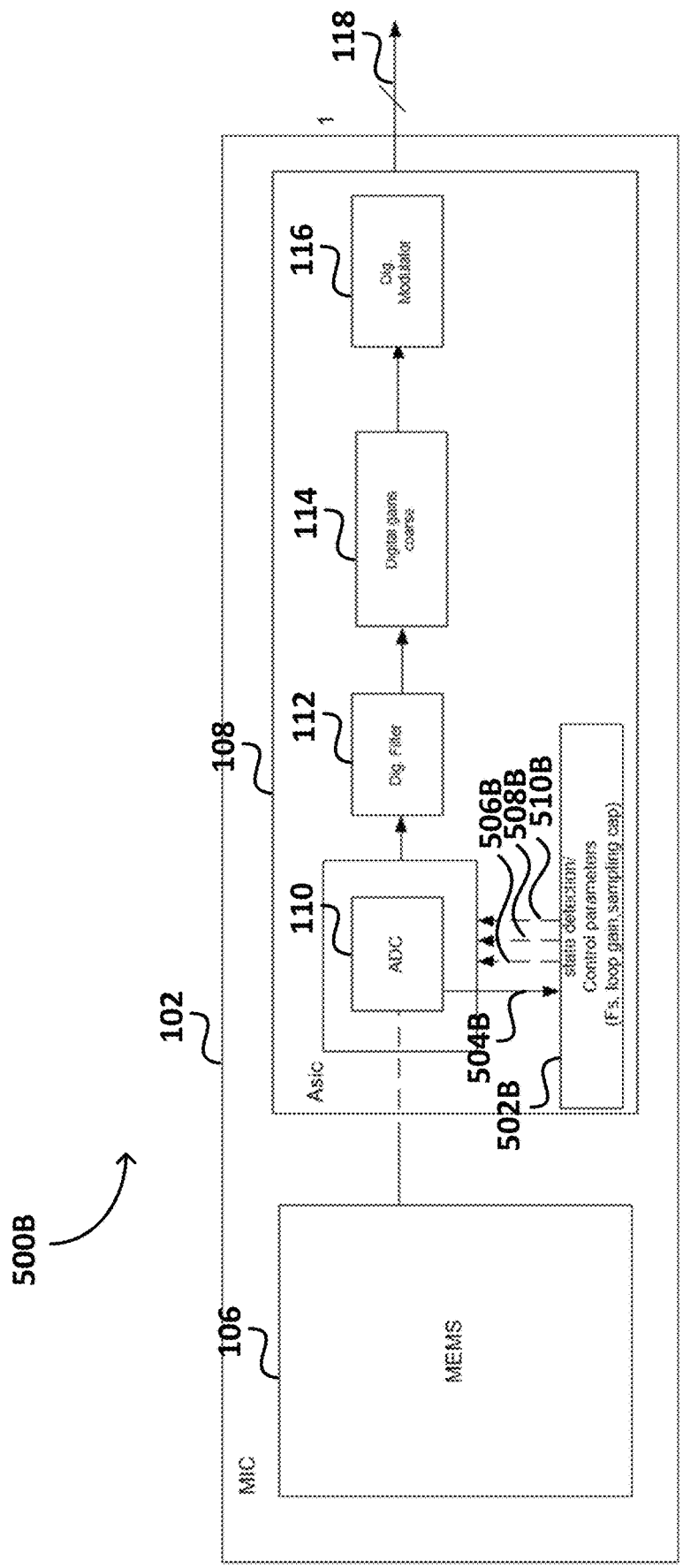
FIG. 5B is a block diagram of a digital microphone capable of a seamless dynamic parameter change in an ADC application, according to an embodiment.

FIG. 5B is a generalized block diagram of a digital microphone 500B having a dynamic parameter change in an ADC application, according to an embodiment. Digital microphone includes a package 102, a MEMS device 106, an ASIC 108, an ADC no, a digital filter 112, a digital gain block 113, a digital modulator 116 and a single-bit output 118, all previous described. Digital microphone 500B includes a state detection and parameter control block 502B having an input coupled to the ADC no (at an output of one or more integrators) and an output for controlling one or more components (for example a variable gain block) with one or more control signals. For example, the one more control signals can include a control signal 506B for controlling the frequency $F_s$ of a clock signal or other signal of the ADC no, a control signal 508B for controlling the loop gain of the ADC no or the gain value of a gain block within the ADC no, or a control signal 510B for controlling the value of other components, such as the capacitance of one or more switched capacitors in the ADC no. While typically only one control signal is used, other embodiments can use more than one control signal to dynamically change more than one parameter simultaneously.

Figure 6A:
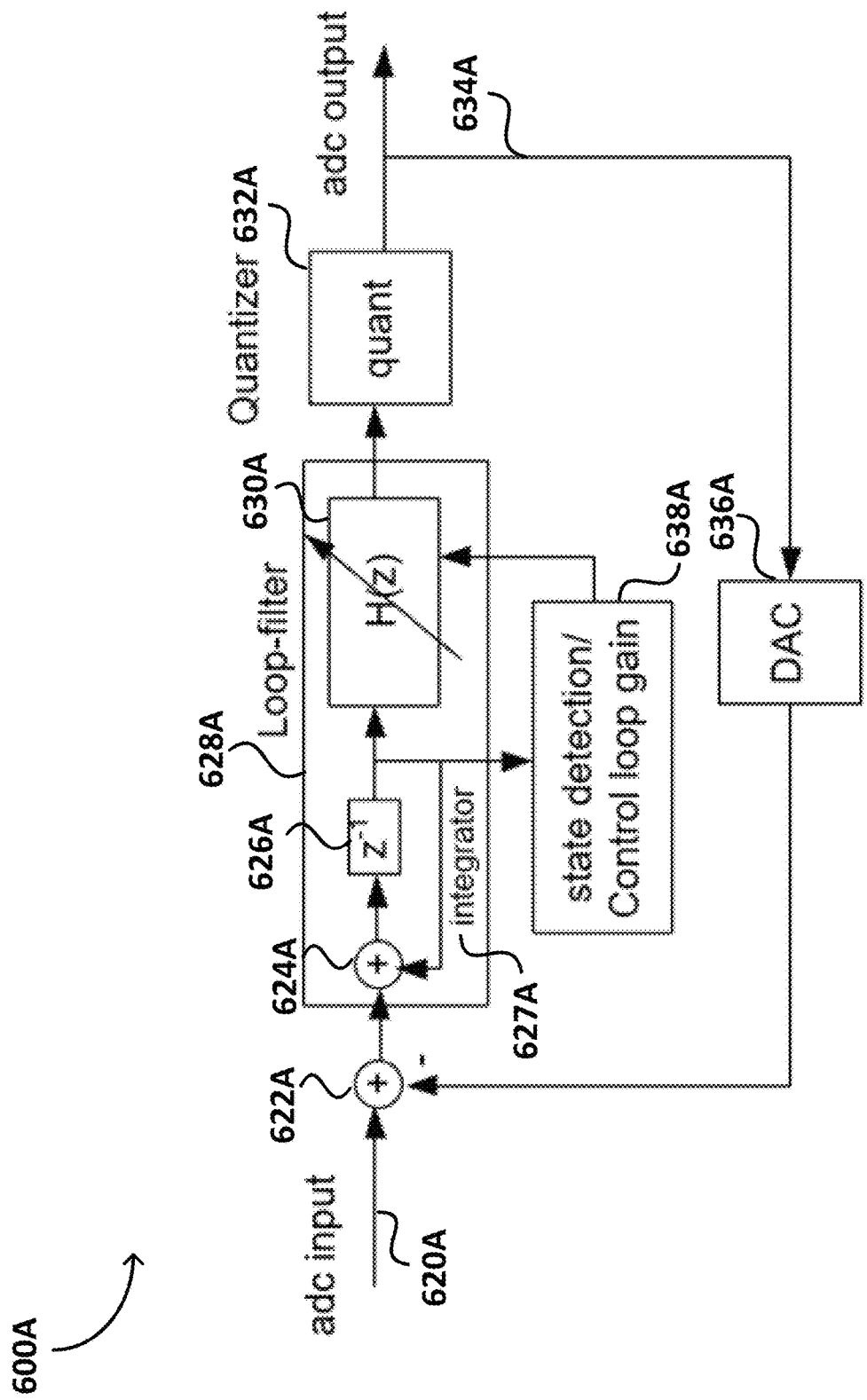
FIG. 6A is a block diagram of an ADC capable of a seamless dynamic parameter change, according to an embodiment.

FIG. 6A is a block diagram of an ADC 600A capable of a seamless dynamic parameter change, that can be used in a digital microphone, according to an embodiment. In some embodiments, ADC 600A is a sigma-delta ADC. ADC 600A comprises a first summer 622A having an input coupled to the ADC input 620A. Signal processing block 628A including integrator 627A and loop filter 630A is coupled to an output of first summer 622A. Integrator 627A includes a second summer 624A and a reciprocal Z transform transfer function block 626A. The output of reciprocal Z transform transfer function block 626A is coupled to an input of second summer 624A. Loop filter 630A can comprise a digital low pass filter, wherein the coefficients of the filter can be changed in different operational modes. The output of signal processing block 628A is coupled to the input of quantizer 632A, and the output of quantizer is coupled to the ADC output 634A, which is a single-bit output in an embodiment. A digital-to-analog converter 636A has an input coupled to ADC output 634A and an output coupled to an input of first summer 622A.

In ADC 600A of FIG. 6A, the seamless dynamic parameter change is accomplished by the addition of the state detection and loop gain control block 638A, which has an input coupled to the output of integrator 627A and an output coupled to a control input of loop filter 630A. State detection and loop gain control block 638A monitors the output of integrator 627A and determines whether or not integrator 627A is in the mean integrator state or not. If so, state detection and loop gain control block 638A generates a control signal that signals to loop filter 630A that the coefficients of the filter can be safely changed without generating audible artefacts. If not, the control signal is either not generated or switched to a level that does not enable changing of the coefficients.

Figure 6B:
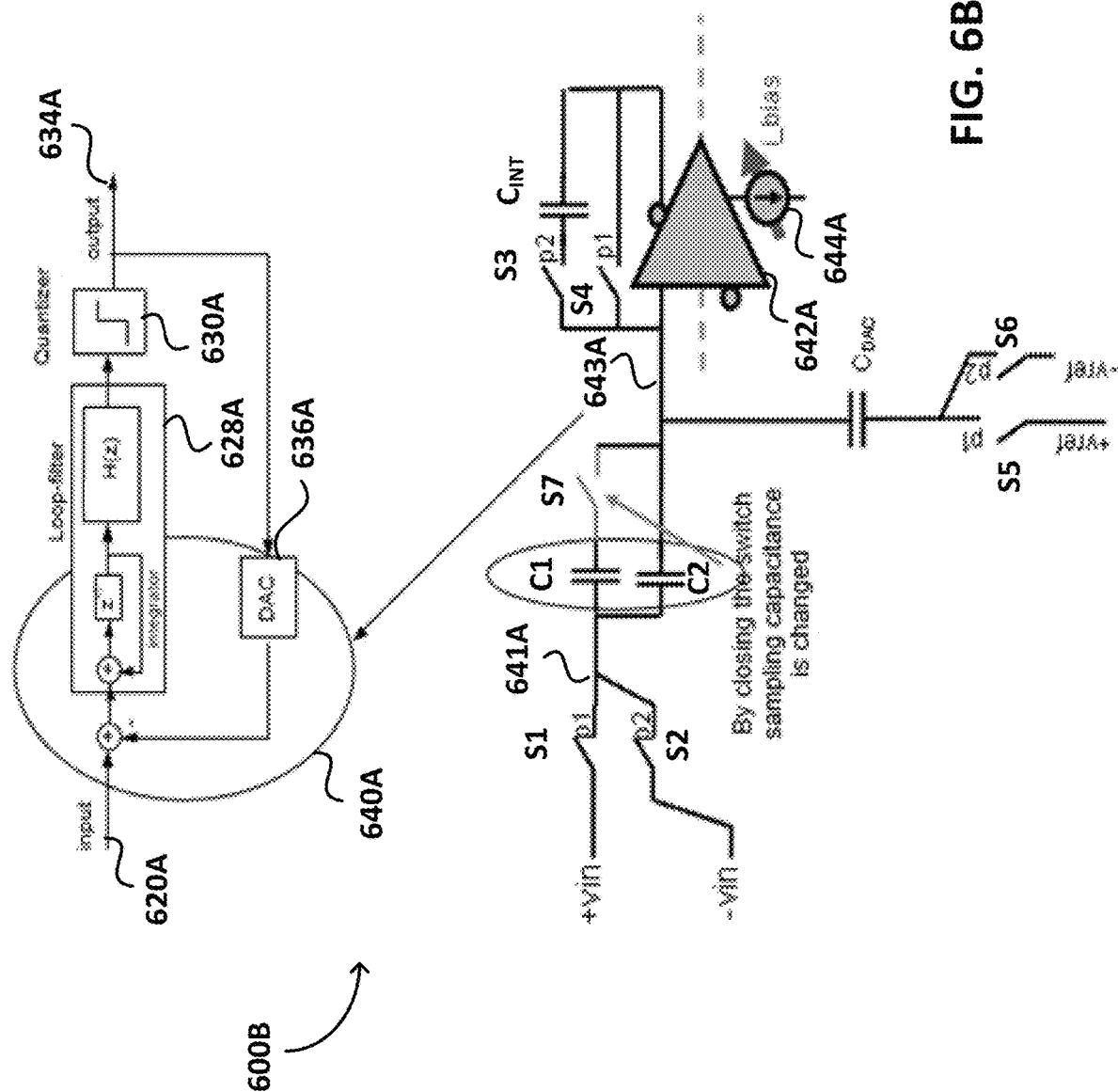
FIG. 6B is a block diagram of a switched capacitor sigma-delta ADC capable of seamless dynamic parameter change by changing the value of the sampling capacitance, according to an embodiment.

FIG. 6B is a block diagram of a switched capacitor sigma-delta ADC 600B capable of seamless dynamic parameter change by changing the value of the sampling capacitance, according to an embodiment. Certain components from ADC 600A are reproduced in FIG. 6A to show the location of the switched capacitor circuitry, including ADC input 620A, signal processing block 628A, quantizer 632A, ADC output 34A, and DAC 636A. The general location of the switched capacitor circuitry is shown in delimited area 640A, and further details of the switched capacitor circuitry are shown in the lower portion of FIG. 6B.

In some embodiments, the switched capacitor circuitry can include a differential input signal including +vin and −vin single-ended inputs respectively coupled to a first terminal of switch S1 and a first terminal of switch S2. Switch S1 and switch S2 are switched with two alternate phase signals p1 and p2. A second terminal of switch S1 and a second terminal of switch S2 are coupled together at node 641A. A first terminal of capacitor C1 and a first terminal of capacitor C2 are coupled to node 641A. A second node of capacitor C1 is coupled to a first terminal of switch S7. A second terminal of switch S7 and a second terminal of capacitor C2 are coupled together at node 643A. A control terminal of switch S7 is coupled to the state detection and loop gain control block 638A shown in FIG. 6A. By closing switch S7 the sampling capacitance is changed and has a value determined by the parallel combination of capacitor C1 and capacitor C2. When switch S7 is open, the sampling capacitance has a value equal to the value of only capacitor C2. DAC capacitor CDAC has a first terminal coupled to node 643A, and a second terminal coupled to switch S5 and switch S6. The second terminal of switch S5 is coupled to a positive reference voltage +vref, and the second terminal of switch S6 is coupled to a negative reference voltage −vref. Switch S5 and switch S6 are switched with the two alternative phase signals p1 and p2. In an embodiment the integrator comprises a differential operational amplifier 642A having an input coupled to node 643A and an integrating capacitor $C_{INT}$ is selectively coupled between an output of differential operational amplifier 642A and node 643A through switch S3. The same output is also selectively coupled to node 643A through switch S4. Switch S3 and switch S4 are switched with the two alternative phase signals p1 and p2. Differential operational amplifier 642A is powered by a variable bias current source 644A (i_bias) in some embodiments.

FIG. 6B thus shows a switched capacitor sigma-delta ADC 600B capable of dynamic parameter change (changing the value of a capacitor in a switched capacitor circuit) that can be done in a manner that will not cause significant audio artefacts, since the parameter change is done when the output of the integrator in the ADC is in a mean value state.

Figure 6C:
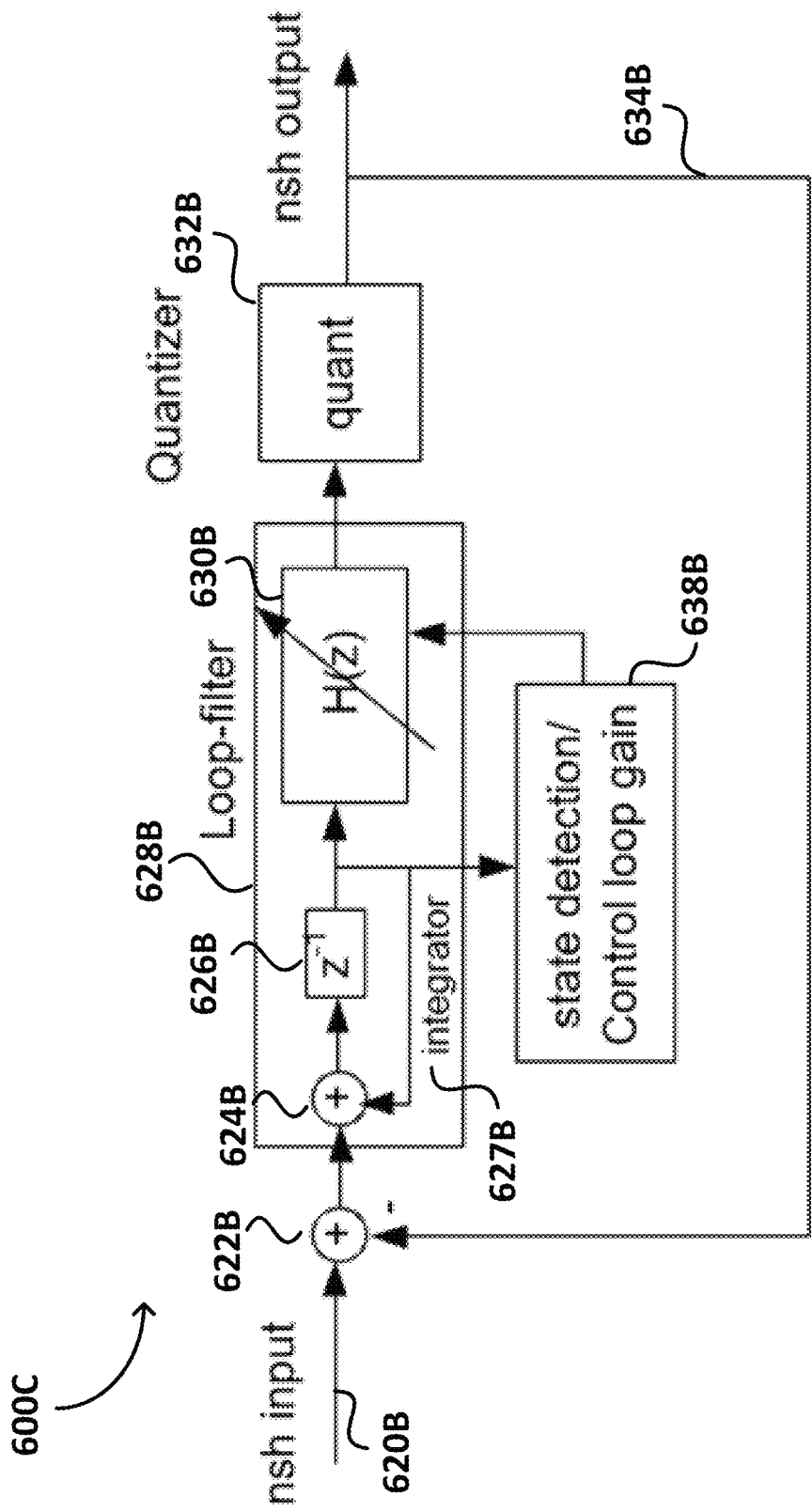
FIG. 6C is a block diagram of digital modulator (noise shaper) capable of seamless dynamic parameter change, according to an embodiment.

FIG. 6C is a block diagram of digital modulator 600C (noise shaper) capable of seamless dynamic parameter change, that can be used in a digital microphone, according to an embodiment. Digital modulator 600C comprises a first summer 622B having an input coupled to the nsh (noise shaper) input 620B. Signal processing block 628B including integrator 627B and loop filter 630B is coupled to an output of first summer 622B. Integrator 627B includes a second summer 624B and a reciprocal Z transform transfer function block 626B. The output of reciprocal Z transform transfer function block 626B is coupled to an input of second summer 624B. Loop filter 630B can comprise a digital low pass filter, wherein the coefficients of the filter can be changed in different operational modes. The output of signal processing block 628B is coupled to the input of quantizer 632B, and the output of quantizer is coupled to the digital modulator nsh (noise shaper) output 634B, which is a single-bit output in an embodiment.

In digital modulator 600C of FIG. 6B, the seamless dynamic parameter change is accomplished by the addition of the state detection and loop gain control block 638B, which has an input coupled to the output of integrator 627B and an output coupled to a control input of loop filter 630B. State detection and loop gain control block 638B monitors the output of integrator 627B and determines whether or not integrator 627B is in the mean integrator state or not. If so, state detection and loop gain control block 638B generates a control signal that signals to loop filter 630B that the coefficients of the filter can be safely changed without generating audible artefacts. If not, the control signal is either not generated or switched to a level that does not enable changing of the coefficients.

Figure 6D:
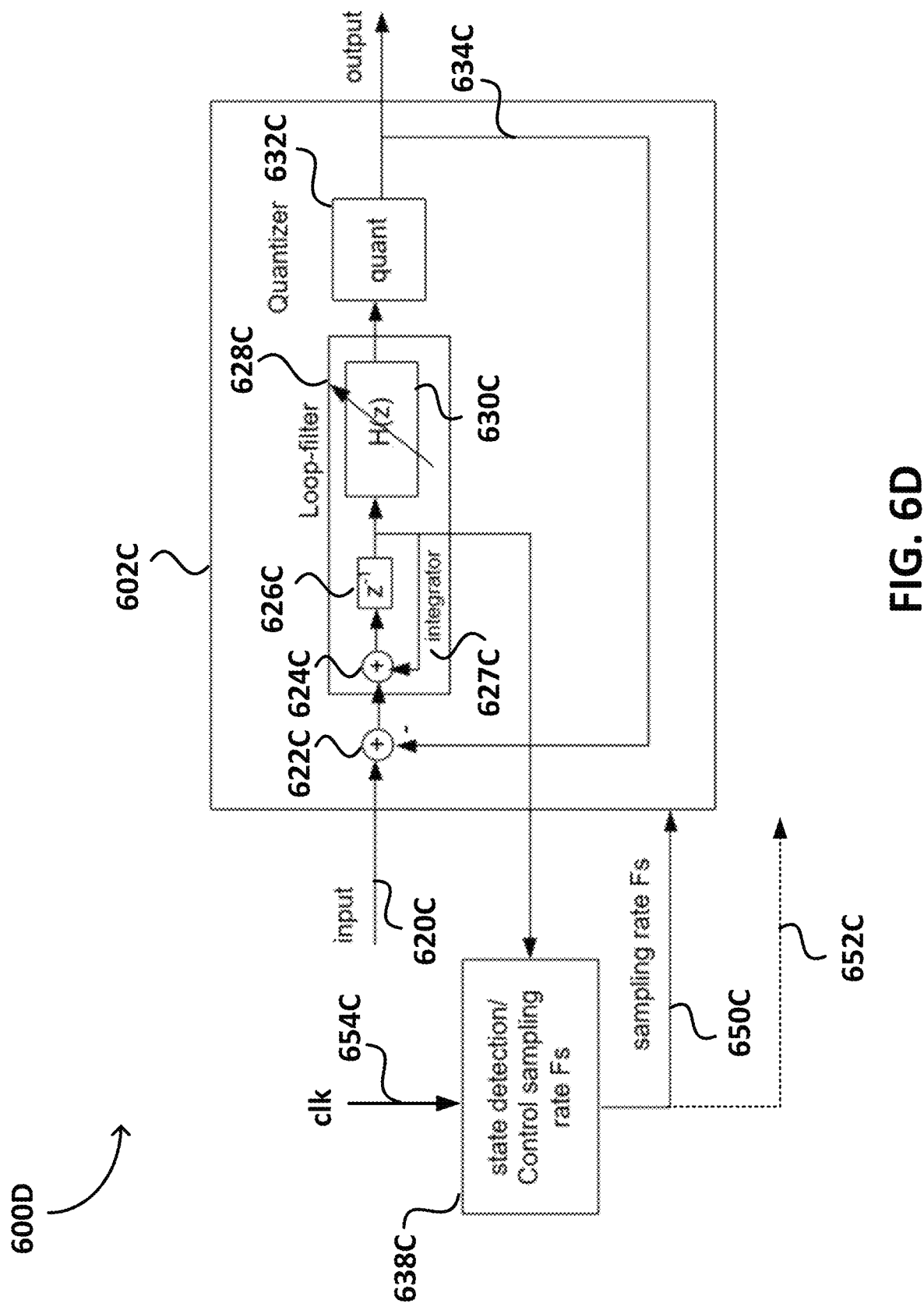
FIG. 6D is a block diagram of a digital modulator/ADC capable of seamless dynamic change by changing of the sampling rate, according to an embodiment.

FIG. 6D is a block diagram of a digital modulator/ADC 600D with the capability of a dynamic change of sampling rate that can be used in a digital microphone, according to an embodiment. In some embodiments, digital modulator/

ADC 600 comprises a digital modulator or a sigma-delta ADC. Digital modulator/ADC 600D comprises a first summer 622C having an input coupled to input 620C. Signal processing block 628C including integrator 627C and loop filter 630C is coupled to an output of first summer 622C. Integrator 627C includes a second summer 624C and a reciprocal Z transform transfer function block 626C. The output of reciprocal Z transform transfer function block 626C is coupled to an input of second summer 624C. Loop filter 630C can comprise a digital low pass filter. The output of signal processing block 628C is coupled to the input of quantizer 632C, and the output of quantizer is coupled to output 634A, which is a single-bit output in an embodiment. In embodiments, some or all of the components of digital modulator/ADC 600D can be fabricated in an ASIC 602C.

In digital modulator/ADC 600D of FIG. 6D, the seamless dynamic parameter change is accomplished by the addition of the state detection and sampling rate control block 638C, which has an input coupled to the output of integrator 627C, an input for receiving a system clock 654C (clk), and an output 650C (sampling rate Fs) coupled to any of the components in ASIC 602C. The output 650C comprises a clock signal that has the same frequency as the system clock in a first mode of operation, and comprises a clock signal that has a lower frequency that the system clock in a second mode of operation. In some embodiments, state detection and loop gain control block 638C can include a frequency divider or other digital signal processing components for generating the signal at output 650C. In some embodiments, state detection and loop gain control block 638C can include an additional output 652C for distributing the signal at output 650C to any component within a digital microphone comprising the digital modulator/ADC 600D of FIG. 6D. In some embodiments, state detection and loop gain control block 638C can comprise first and second clock signal inputs and a switch for selecting between the first and second clock signal inputs to generate one or more of output 650C and output 652C.

State detection and loop gain control block 638C monitors the output of integrator 627C and determines whether or not integrator 627C is in the mean integrator state or not. If so, state detection and loop gain control block 638C safely changes the frequency of the clock signal at output 650C and/or output 652C without generating audible artefacts. If not, the frequency of the clock signal at output 650C and/or output 652C remains constant and is not changed.

Figure 7:
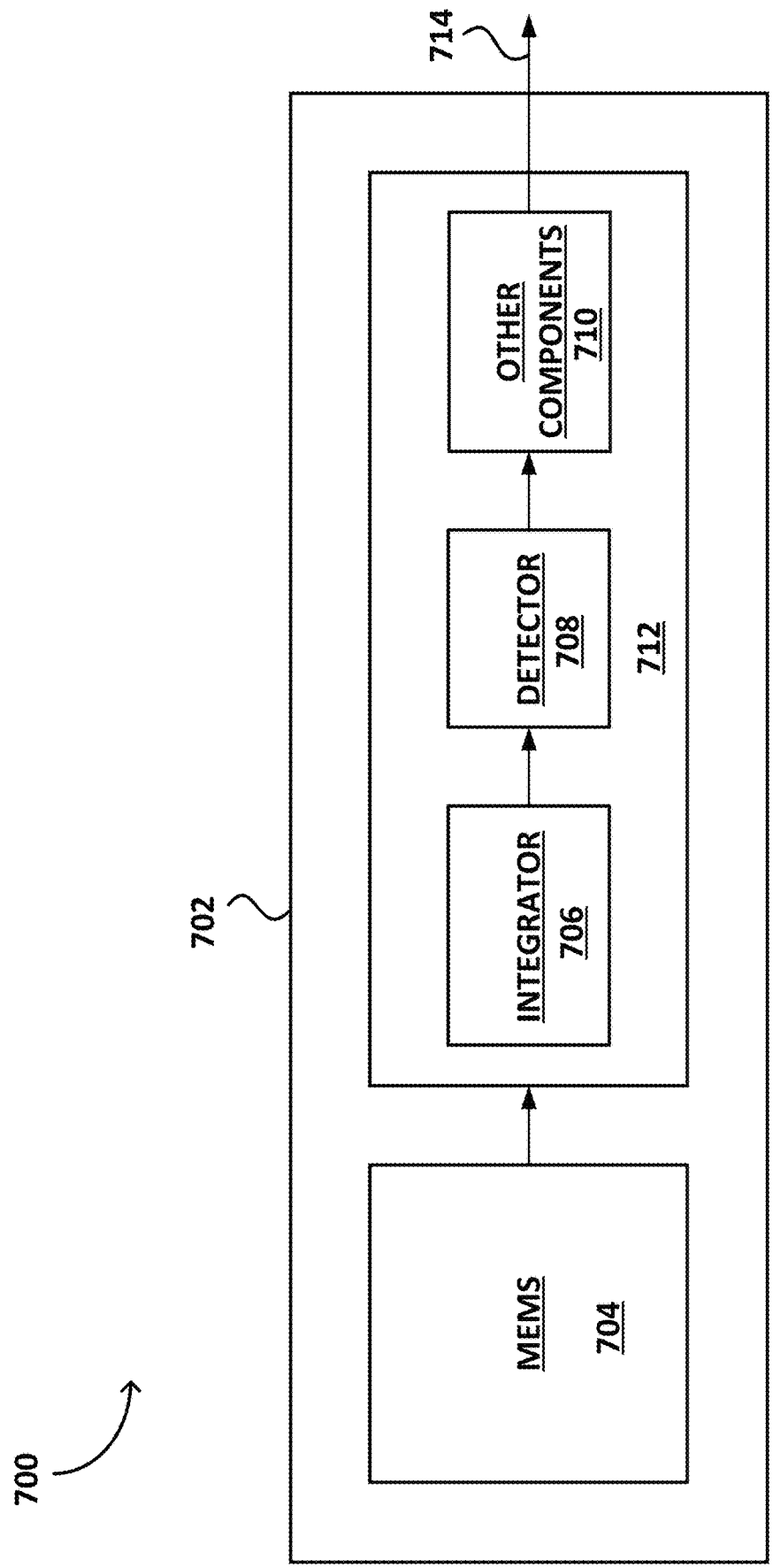
FIG. 7 is a generalized microphone block diagram capable of seamless dynamic parameter change, according to an embodiment.

FIG. 7 is a generalized block diagram 700 of a digital microphone 702 comprising a seamless dynamic parameter change capability. Digital microphone includes a MEMS device 704 coupled to an ASIC 712. ASIC 712 includes at least one integrator 706 coupled to a detection and control component 708, which is in turned coupled to one or more other components 710 of the digital microphone. At least one of the other components 710 provides an output signal at output 714. As previously described, the detector and control component 708 monitors the various output states of the at least one integrator 706 and generates a control signal or other signal for changing a parameter of at least one of the other components 710. For example, detector and control component 708 can provide a control signal for changing the value of a gain component, a control signal for changing the value of a capacitor, or can provide different frequency clock signals, or can provide a control signal to a component for changing the frequency of a clock signal, such as a frequency divider.

FIG. 8 is a block diagram of a method 800 of operating a digital microphone that implements seamless dynamic parameter change, according to an embodiment. The method comprises monitoring a state of an integrator of the digital microphone at step 802; generating an output signal having a first level during a first state of the integrator and a second level during a second state of the integrator at step 804; and controlling a parameter value of a signal processing component of the digital microphone with the output signal at step 806.

Example embodiments of the present invention are summarized here. Other embodiments can also be understood from the entirety of the specification and the claims filed herein.

Example 1. According to an embodiment, a digital microphone comprises at least one integrator; a state detection and parameter control component directly coupled to an output of the integrator; and a signal processing component coupled to an output of the state detection and parameter control component, wherein a parameter of the signal processing component comprises a first value in a first operational mode and a second value in a second operational mode different from the first operational mode.

Example 2. The digital microphone of Example 1, wherein the state detection and parameter control component comprises first and second thresholds, and wherein the signal processing component comprises a variable gain component that is configured for changing gain values when the output of the integrator is between the first and second thresholds.

Example 3. The digital microphone of any of the above examples, wherein the signal processing component comprises an analog-to-digital converter (ADC) or a digital modulator of the digital microphone.

Example 4. The digital microphone of any of the above examples, wherein the parameter of the signal processing component comprises a gain, a frequency, or a capacitance.

Example 5. The digital microphone of any of the above examples, wherein the state detection and parameter control component is configured for generating a first output signal value if a state of the integrator is between a first threshold and a second threshold, and for generating a second output signal value if the state of the integrator is not between the first threshold and the second threshold.

Example 6. The digital microphone of any of the above examples, wherein the at least one integrator comprises a plurality of serially-coupled integrators.

Example 7. The digital microphone of any of the above examples, wherein the at least one integrator, the state detection and parameter control component, and the signal processing component are fabricated in an application-specific integrated circuit (ASIC).

Example 8. The digital microphone of any of the above examples, further comprising a microelectromechanical system (MEMS) coupled to the ASIC, wherein the MEMS and the ASIC are fabricated in a semiconductor package.

Example 9. According to an embodiment, a digital modulator comprises a summer; at least one integrator coupled to the summer; a quantizer coupled to the at least one integrator; a state detection and control component coupled to an output of the at least one integrator; and a variable gain block coupled between the state detection and control component, and the summer.

Example 10. The digital modulator of Example 9, wherein the state detection and control component is configured for generating a first output signal if a state of the integrator is between a first threshold and a second threshold, and for generating a second output signal if the state of the integrator is not between the first threshold and the second threshold.

Example 11. The digital modulator of any of the above examples, wherein the variable gain block is configured for having a first gain value in response to the first output signal and for having a second gain value in response to the second output signal.

Example 12. The digital modulator of any of the above examples, wherein the summer is configured for receiving an "m" bit input signal, wherein "m" is an integer greater than one, and wherein the quantizer is configured for providing a single bit output signal.

Example 13. The digital modulator of any of the above examples, wherein the at least one integrator comprises a plurality of serially-coupled integrators.

Example 14. The digital modulator of any of the above examples, further comprising a loop filter interposed between the at least one integrator and the quantizer.

Example 15. According to an embodiment, a method of operating a digital microphone comprises monitoring a state of an integrator of the digital microphone; generating an output signal having a first level during a first state of the integrator and a second level during a second state of the integrator; controlling a parameter value of a signal processing component of the digital microphone with the output signal; and changing an operational mode of the digital microphone only during the first state of the integrator.

Example 16. The method of Example 15, further comprising changing a loop gain of the digital microphone when the state of the integrator is within a predetermined range of values.

Example 17. The method of any of the above examples, wherein the signal processing component comprises an analog-to-digital converter (ADC) or a digital modulator of the digital microphone.

Example 18. The method of any of the above examples, wherein the parameter value of the signal processing component comprises a gain value, a frequency value, or a capacitance value.

Example 19. The method of any of the above examples, wherein the parameter value comprises a first value in a high signal-to-noise ratio (SNR) operational mode of the digital microphone, and wherein the parameter value comprises a second value in a low SNR operational mode of the digital microphone.

Example 20. The method of any of the above examples, further comprising generating the first level if the first state of the integrator is between a first threshold and a second threshold, and for generating the second level if the second state of the integrator is not between the first threshold and the second threshold.

Digital components shown and described herein can be fabricated as digital circuit components in one or more integrated circuits. The digital components shown and described herein can also be implemented in a microprocessor executing instructions for providing the digital circuit component function. In addition, at least one of the digital components shown and described herein can be implemented as analog components. For example, in some embodiments an analog modulator can be used. Although a digital microphone has been described, embodiment concepts can be implemented in an analog microphone having an integrator and a first (high performance) operational mode and a second (power saving) operational mode, wherein dynamic switching is desired between the first operational mode and the second operational mode, or within one of the operational modes, without generating significant audio artefacts during switching events.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A digital microphone comprising:
    at least one integrator;
    a state detection and parameter control component directly coupled to an output of the integrator; and
    a signal processing component coupled to an output of the state detection and parameter control component, wherein a parameter of the signal processing component comprises a first value in a first operational mode and a second value in a second operational mode different from the first operational mode,
    wherein the state detection and parameter control component comprises first and second thresholds, and wherein the signal processing component comprises a variable gain component that is configured for changing gain values when the output of the integrator is between the first and second thresholds.

2. The digital microphone of claim 1, wherein the signal processing component comprises an analog-to-digital converter (ADC) or a digital modulator of the digital microphone.

3. The digital microphone of claim 1, wherein the parameter of the signal processing component comprises a gain, a frequency, or a capacitance.

4. The digital microphone of claim 1, wherein the at least one integrator comprises a plurality of serially-coupled integrators.

5. The digital microphone of claim 1, wherein the at least one integrator, the state detection and parameter control component, and the signal processing component are fabricated in an application-specific integrated circuit (ASIC).

6. The digital microphone of claim 5, further comprising a microelectromechanical system (MEMS) coupled to the ASIC, wherein the MEMS and the ASIC are fabricated in a semiconductor package.

7. A method of operating a digital microphone, the method comprising:
    monitoring a state of an integrator of the digital microphone;
    generating an output signal having a first level during a first state of the integrator and a second level during a second state of the integrator;
    controlling a parameter value of a signal processing component of the digital microphone with the output signal; and
    changing an operational mode of the digital microphone only during the first state of the integrator.

8. The method of claim 7, further comprising changing a loop gain of the digital microphone when the state of the integrator is within a predetermined range of values.

9. The method of claim 7, wherein the signal processing component comprises an analog-to-digital converter (ADC) or a digital modulator of the digital microphone.

10. The method of claim 7, wherein the parameter value of the signal processing component comprises a gain value, a frequency value, or a capacitance value.

11. The method of claim 7, wherein the parameter value comprises a first value in a high signal-to-noise ratio (SNR) operational mode of the digital microphone, and wherein the parameter value comprises a second value in a low SNR operational mode of the digital microphone.

12. The method of claim 7, further comprising generating the first level if the first state of the integrator is between a first threshold and a second threshold, and for generating the second level if the second state of the integrator is not between the first threshold and the second threshold.

13. A digital microphone comprising:
   at least one integrator;
   a state detection and parameter control component directly coupled to an output of the integrator; and
   a signal processing component coupled to an output of the state detection and parameter control component, wherein a parameter of the signal processing component comprises a first value in a first operational mode and a second value in a second operational mode different from the first operational mode,
   wherein the state detection and parameter control component is configured for generating a first output signal value if a state of the integrator is between a first threshold and a second threshold, and for generating a second output signal value if the state of the integrator is not between the first threshold and the second threshold.

\* \* \* \* \*